(12) United States Patent
Okabe et al.

(10) Patent No.: US 10,566,227 B2
(45) Date of Patent: Feb. 18, 2020

(54) CONTROLLING METHOD FOR A WAFER TRANSPORTATION PART AND A LOAD PORT PART ON AN EFEM

(71) Applicant: TDK CORPORATION, Tokyo (JP)

(72) Inventors: Tsutomu Okabe, Tokyo (JP); Hidetoshi Horibe, Tokyo (JP)

(73) Assignee: TDK CORPORATION, Tokyo (JP)

( * ) Notice: Subject to any disclaimer, the term of this patent is extended or adjusted under 35 U.S.C. 154(b) by 383 days.

(21) Appl. No.: 15/373,210

(22) Filed: Dec. 8, 2016

(65) Prior Publication Data

US 2017/0170044 A1 Jun. 15, 2017

(30) Foreign Application Priority Data

Dec. 11, 2015 (JP) ................. 2015-242040

(51) Int. Cl.
| | |
|---|---|
| *H01L 21/677* | (2006.01) |
| *H01L 21/673* | (2006.01) |
| *H01L 21/67* | (2006.01) |
| *H01L 21/02* | (2006.01) |

(52) U.S. Cl.
CPC .. *H01L 21/67703* (2013.01); *H01L 21/02046* (2013.01); *H01L 21/67017* (2013.01); *H01L 21/67393* (2013.01); *H01L 21/67772* (2013.01); *H01L 21/67775* (2013.01)

(58) Field of Classification Search
CPC ......... H01L 21/67703; H01L 21/67775; H01L 21/67772; H01L 21/67017; H01L 21/67393; H01L 21/02046
See application file for complete search history.

(56) References Cited

U.S. PATENT DOCUMENTS

| | | | |
|---|---|---|---|
| 10,134,619 B2* | 11/2018 | Kondoh | ............ H01L 21/67389 |
| 2003/0009904 A1 | 1/2003 | Tokunaga | |
| 2004/0132399 A1* | 7/2004 | Yasukawa | ............. F24F 3/1607 |
| | | | 454/187 |
| 2006/0272169 A1 | 12/2006 | Miyajima | |
| 2006/0288664 A1* | 12/2006 | Okabe | ............... H01L 21/67393 |
| | | | 53/510 |
| 2015/0024671 A1 | 1/2015 | Taniyama et al. | |

(Continued)

FOREIGN PATENT DOCUMENTS

| | | |
|---|---|---|
| CN | 104299934 A | 1/2015 |
| JP | 2004-022674 A | 1/2004 |
| JP | 2004-200669 A | 7/2004 |

(Continued)

*Primary Examiner* — Timothy P. Kelly
(74) *Attorney, Agent, or Firm* — Oliff PLC

(57) ABSTRACT

A controlling method for a wafer transportation part and a load port part on an EFEM includes a fixing step of fixing a container on an installation stand of the load port part, a first cleaning step of connecting a bottom nozzle of the load port part to multiple bottom holes formed on a bottom surface of the container and introducing a cleaning gas into the container and discharging a gas from the container via the nozzle, a connection step of connecting the container and the transportation room, and a wafer transportation step of transporting the wafer from the container to a processing room via the opening and the transportation room and transporting the wafer from the processing room to the container via the transportation room and the opening.

11 Claims, 8 Drawing Sheets

(56) References Cited

U.S. PATENT DOCUMENTS

2015/0221538 A1    8/2015  Ochiai et al.
2017/0025297 A1*   1/2017  Kudo ................ H01L 21/67772

FOREIGN PATENT DOCUMENTS

| JP | 2004-327911 A | 11/2004 |
| JP | 2007-005607 A | 1/2007 |
| JP | 2012-019046 A | 1/2012 |
| JP | 2012-114456 A | 6/2012 |
| JP | 2015-082577 A | 4/2015 |
| JP | 2015-146347 A | 8/2015 |

* cited by examiner

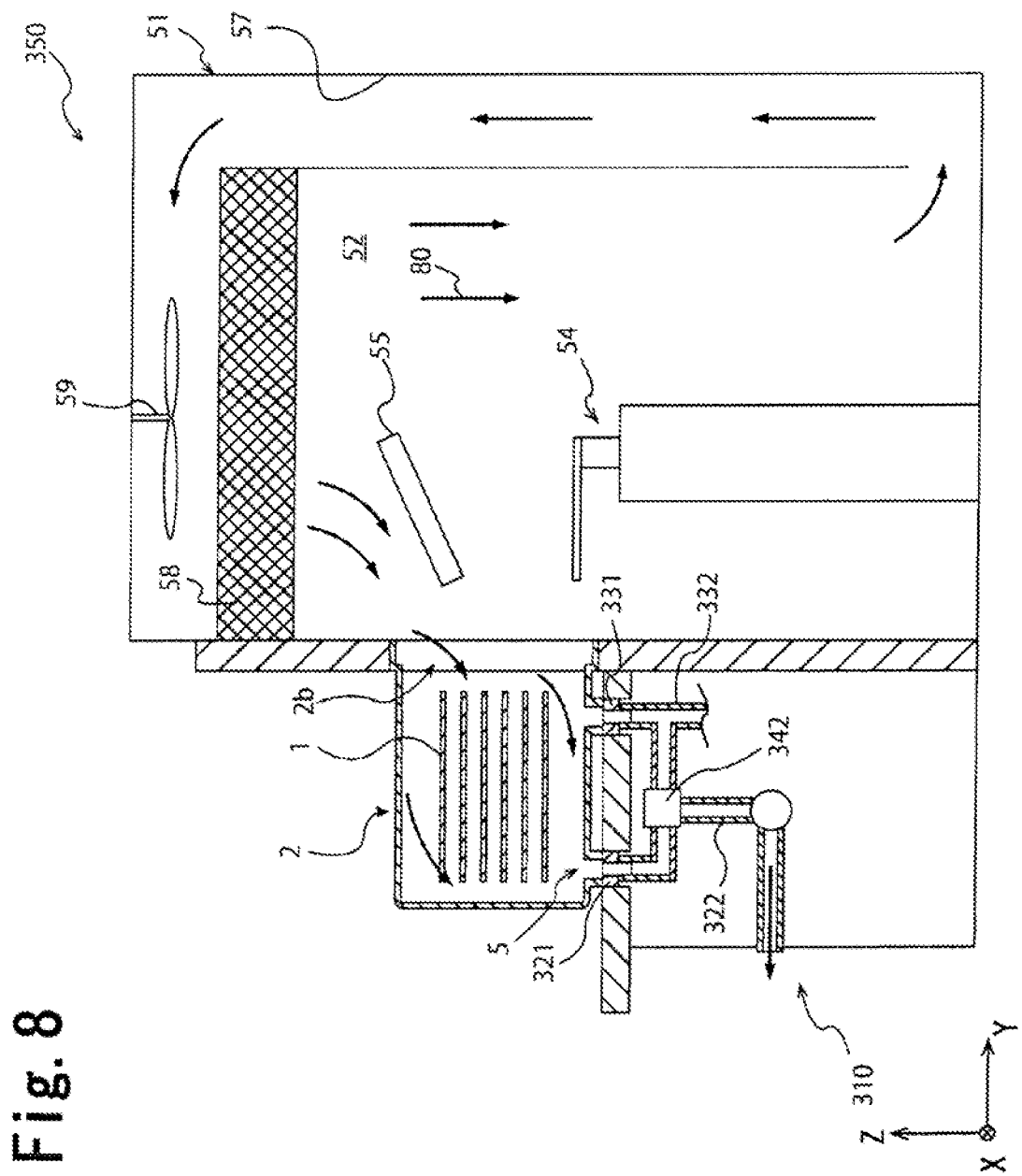

CONTROLLING METHOD FOR A WAFER TRANSPORTATION PART AND A LOAD PORT PART ON AN EFEM

BACKGROUND OF THE INVENTION

1. Field of the Invention

The present invention relates to a controlling method for a wafer transportation part and a load port part on an EFEM.

2. Description of the Related Art

In manufacturing steps of semiconductors, wafers are transported between respective processing apparatuses using a container called a FOUP or so. When the wafers are processed, the wafers in the container are transported from a FOUP to a processing room via an Equipment Front End Module (EFEM) equipped with the respective processing apparatuses.

In the environment of a container housing wafers, it is preferred to maintain an inactive state and a cleanliness that exceed a predetermined level so as to protect the surfaces of the wafers from oxidation and contamination. As a method for improving an inactive state and a cleanliness of a gas in the transportation container, Patent Document 1 proposes a load port apparatus introducing a cleaning gas into a transportation container via a bottom hole formed on the bottom surface of the transportation container and an EFEM containing the load port apparatus.

Patent Document 1: JP 2007-5607A

SUMMARY OF THE INVENTION

As a result of miniaturization of semiconductor circuits, a higher cleanliness has been also recently demanded in the internal environment of the container housing the wafers so as to protect the wafer surfaces from oxidation and contamination. In the course of development for an EFEM maintaining a clean environment of the wafer container, it turned out that there is a problem that the wafer surface before or after processing to be housed in the container is contaminated by an outgas generated from the wafers after being processed, and that this contributes to prevention from improvement in quality.

The prevent invention has been achieved under such circumstances and provides a controlling method for a wafer transportation part and a load port part on an EFEM capable of maintaining a clean environment in a container and protecting a wafer surface from oxidation and contamination.

To achieve the above object, the controlling method for a wafer transportation part and a load port part on an EFEM according to the present invention is a controlling method for a wafer transportation part configured to have a wafer transportation room passed by a wafer transported to a processing room and a load port part configured to airtightly connect a main opening formed on a container housing the wafer to the wafer transportation room on an EFEM, the controlling method including:

a fixing step of fixing the container on an installation stand of the load port part;

a first cleaning step of connecting a bottom nozzle of the load port part to a plurality of bottom holes formed on a bottom surface of the container installed on the installation stand, and introducing a cleaning gas into the container and discharging a gas from the container via the bottom nozzle in a state where the main opening is closed;

a connection step of stopping an introduction of the cleaning gas from the bottom nozzle and opening the main opening so as to airtightly connect the container and the wafer transportation room; and a wafer transportation step of transporting the wafer from the container to the processing room via the main opening being opened and the wafer transportation room, and transporting the wafer from the processing room to the container via the wafer transportation room and the main opening being opened.

In the controlling method according to the present invention, the main opening is opened after the first cleaning step of cleaning the inside of the container so as to connect the container and the wafer transportation room, and it is thus possible to prevent a gas having a low cleanliness from flowing from the container into the wafer transportation room and maintain a favorable cleanliness in the wafer transportation room. In the wafer transportation step, the gas in the container is discharged from at least one of the bottom nozzles connected in the first cleaning step, and it is thus possible to maintain a favorable cleanliness in the container and the wafer transportation room even in the wafer transportation step. In the wafer transportation step, the gas in the container is discharged from the bottom nozzle, and it is thus possible to prevent a problem that an outgas generated from a wafer soon after being processed flows into the wafer transportation room.

For example, the controlling method of the EFEM according to the present invention may further include a detection step of detecting a cleanliness in the container, and the connection step may be carried out after the detection step detects that the inside of the container is cleaner than a predetermined state.

The controlling method of the EFEM according to the present invention has the detection step, and it is thus possible to securely prevent the gas having a low cleanliness from flowing from the container into the wafer transportation room and shorten the introduction time of the cleaning gas in the first cleaning step if the inside of the container has a high cleanliness.

For example, the controlling method of the EFEM according to the present invention may further include a second cleaning step of introducing the gas from the wafer transportation room into the container via the main opening being opened.

The introduction of the gas from the wafer transportation room into the container forms a current going from the main opening toward the bottom hole in the container. In the controlling method of the EFEM, it is thus possible to quickly discharge the outgas generated from a wafer soon after being processed from the container and effectively prevent a problem that the outgas contaminates and oxidizes the wafer in the container.

For example, the second cleaning step may introduce the gas from the wafer transportation room into the container by a current plate configured to introduce a part of a downward current in the wafer transportation room to the main opening.

The controlling method of the EFEM achieves the introduction of the gas from the wafer transportation room into the container and is easily carried out due to a simple configuration of the current plate. The method for introducing the part of the downward current in the transportation room into the container can divert the system of cleaning the inside of the wafer transportation room into cleaning the container, and it is thus possible to clean the container using a simple device.

For example, the second cleaning step may discharge the gas in the container via at least one of the bottom nozzles connected to the bottom hole in the first cleaning step and communicated with a bottom hole formed at a position distant from the main opening more than a bottom surface middle on the bottom surface of the container.

The bottom hole configured to discharge the gas in the container is arranged at a position distant from the main opening, and a current from the main opening to the bottom hole is thus formed in a large space in the container. The controlling method of the EFEM can thus efficiently discharge the outgas generated from the wafer soon after being processed from the container.

BRIEF DESCRIPTION OF THE DRAWINGS

FIG. 8 is a schematic view of an EFEM according to Fourth Embodiment of the present invention.

DESCRIPTION OF THE PREFERRED EMBODIMENTS

Hereinafter, the present invention will be described based on embodiments shown in the figures.

Figure 1:
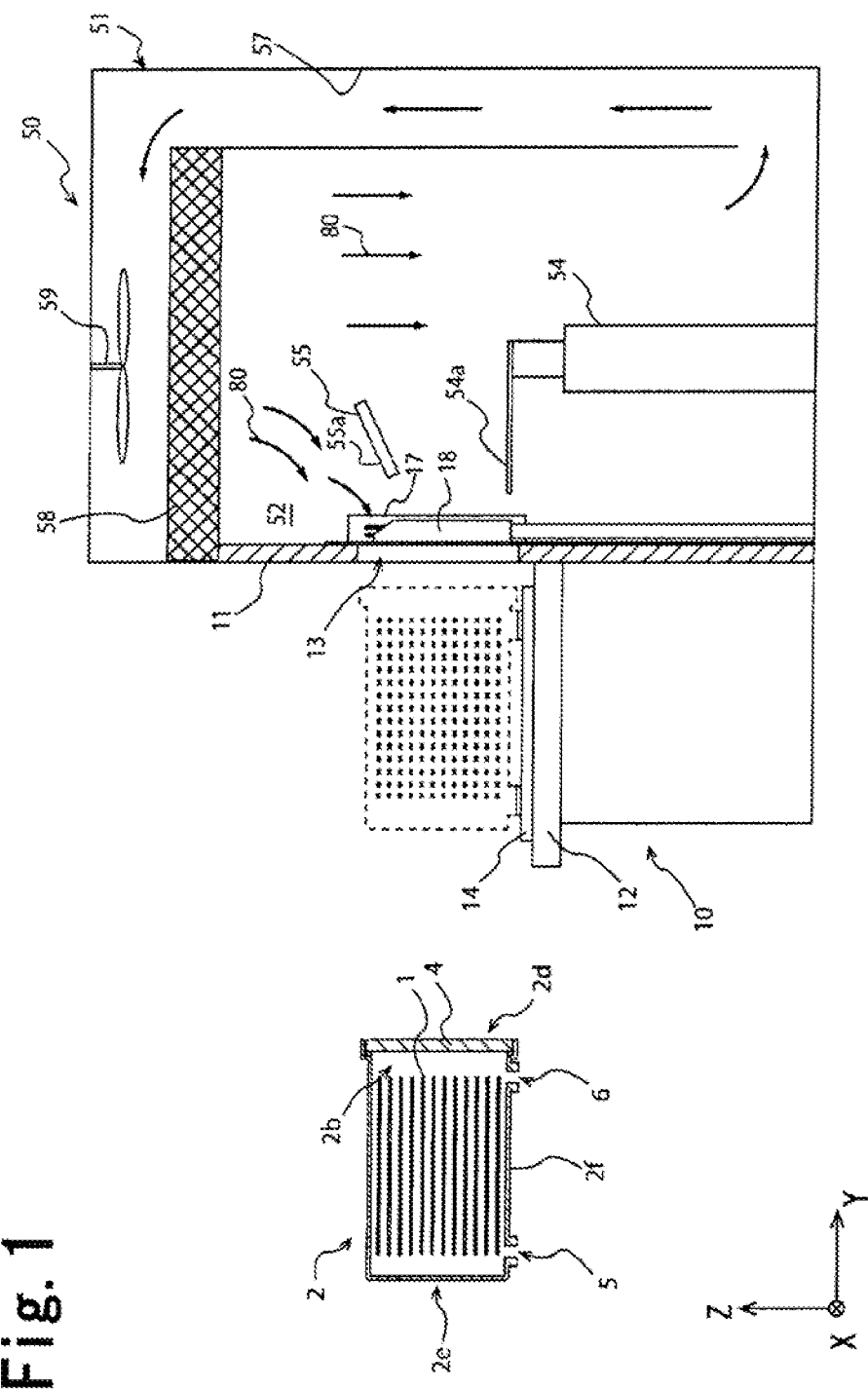
FIG. 1 is a schematic view of an EFEM according to an embodiment of the present invention.

As shown in FIG. 1, an EFEM 50 used for a controlling method according to an embodiment of the present invention is a front end module of a semiconductor processing apparatus, and has a load port part 10 and a wafer transportation part 51. A wafer transportation room 52 of the EFEM 50 is a space connecting between a FOUP 2 as a container for transporting wafers 1 and a processing room (not shown). A transportation robot 54 arranged in the wafer transportation room 52 transports the wafers 1 in the FOUP 2 to the processing room. Thus, the wafers 1 subjected to a predetermined processing in the processing room are transported from the inside of the FOUP 2 to the processing room via the wafer transportation room 52.

In addition to the wafer transportation room 52 passed by the wafers 1, the wafer transportation part 51 has a transportation room fan 59 and a circulating passage 57. The transportation room fan 59 is a downward current forming means and forms a downward current 80 in the wafer transportation room. The circulating passage 57 is where a gas in the wafer transportation room 52 detours and rises to form the downward current 80 once again in the wafer transportation room 52. As described below, the wafer transportation part 51 also has a transportation room filter 58 and a current plate 55.

The transportation room fan 59 is provided over the wafer transportation room 52 and forms a current in the wafer transportation room 52 and the circulating passage 57. For example, the transportation room fan 59 has blades inclined toward a rotation direction and a motor for rotating the blades. Incidentally, the downward current forming means is not limited to the transportation room fan 59 having the rotating blades, and another current forming means, such as air compressor, may be employed as the downward current forming means of the wafer transportation part 51.

The circulating passage 57 is connected to the wafer transportation room 52 at upper and lower parts of the wafer transportation part 51, and the space between the upper and lower parts is divided by an intermediate wall with respect to the wafer transportation room 52. A transportation room filter 58 as a circulating gas cleaning means for cleaning the gas circulating in the wafer transportation room 52 and the circulating passage 57 is arranged between the wafer transportation room 52 and the circulating passage 57. The transportation room filter 58 is arranged above the wafer transportation room 52 and below the transportation room fan 59. For example, the transportation room filter 58 is made of an ULPA filter, but is not limited. The transportation room filter 58 and the transportation room fan 59 may consist of an integrated unit (fan filter unit), but may consist of different parts.

The transportation room fan 59 forms a current in the direction shown by thick arrows in FIG. 1. The gas raised in the circulating passage 57 passes through the transportation room filter 58, is cleaned, and then flows into the wafer transportation room 52 due to the blowing effect of the transportation room fan 59. Furthermore, the gas flown into the wafer transportation room 52 falls in the wafer transportation room 52 and flows into the circulating passage 57 from a lower communication port. Then, the gas flown into the circulating passage 57 rises. In this way, a circulating current is formed in the wafer transportation room 52 and the circulating passage 57 by forming the downward current 80 in the wafer transportation room 52 and by forming the upward current in the circulating passage 57.

Figure 4:
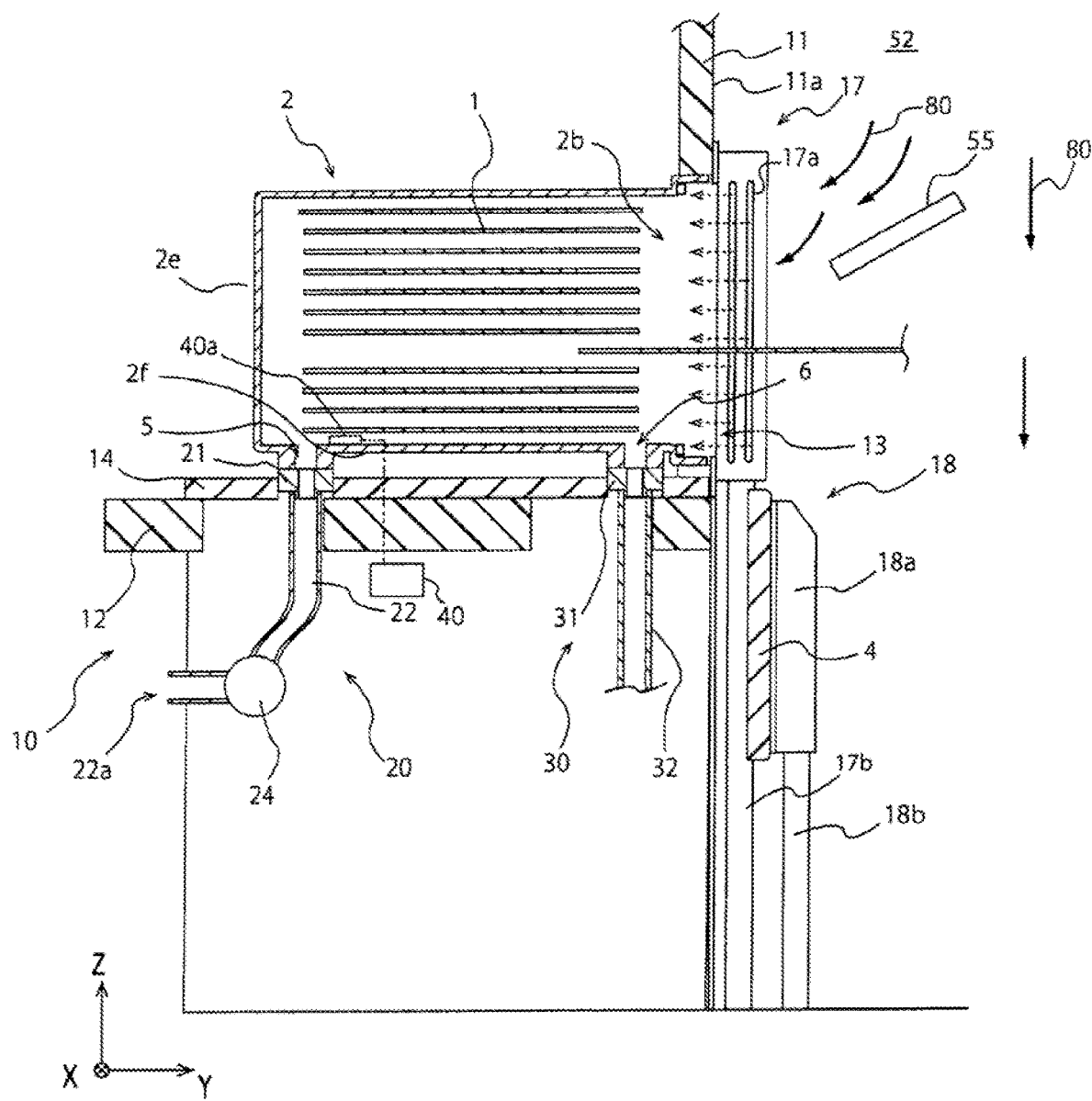
FIG. 4 is a conceptual figure showing a state of the EFEM in a vicinity of a door in a state where a main opening of a container is opened.

The current plate 55 is arranged in a vicinity of a delivery port 13 of the wafer transportation room 52. The current plate 55 has an inclined surface 55a inclined toward a horizontal direction, and a part of the downward current formed in the wafer transportation room 52 collides with the current plate 55 and changes its moving direction. As shown in FIG. 1, the inclined surface 55a is inclined obliquely downward from the middle of the wafer transportation room 52 toward the delivery port 13. Thus, a door 18a is opened as shown in FIG. 4, and the part of the downward current 80 formed in the wafer transportation room 52 is guided by the inclined surface 55a of the current plate 55 and thereby flows into the FOUP 2 connected to the wafer transportation room 52 via the main opening 2b in a state where the FOUP 2 is communicated with the wafer transportation room 52 via the main opening 2b.

Figure 3:
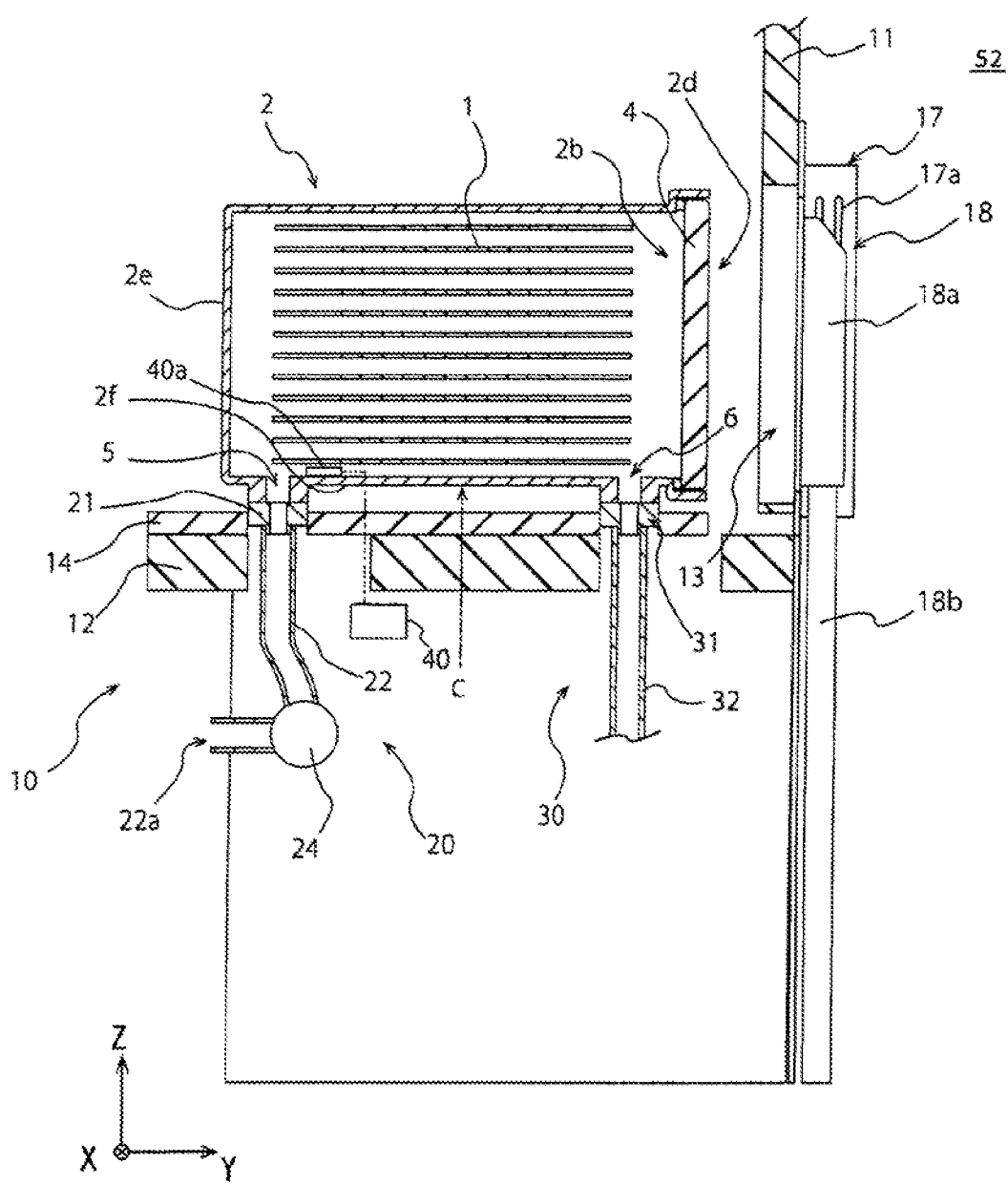
FIG. 3 is a conceptual figure showing a state of the EFEM in a vicinity of a door in a state where a main opening of a container is closed.

The load port part 10 shown in FIG. 1 has an installation stand 14 for installing the FOUP 2, an opening and closing part 18 for opening and closing the main opening 2b of the FOUP 2, and a front gas introduction part 17 for introducing a cleaning gas from the main opening 2b into the FOUP 2. As shown in FIG. 3, the load port part 10 has a gas discharge part 20 and a bottom gas introduction part 30. The gas discharge part 20 can discharge the gas in the FOUP 2 to the outside via a first bottom hole 5 formed on the FOUP 2. The bottom gas introduction part 30 introduces a cleaning gas into the FOUP 2 via a second bottom hole 6 formed on the FOUP 2. The load port part 10 further has a cleanliness detection part 40 configured to detect a cleanliness of the gas in the FOUP 2. As described below, the load port part 10 can airtightly connect the main opening 2b formed on the FOUP 2 containing the wafers 1 to the wafer transportation room 52.

As shown in FIG. 1, the installation stand 14 of the load port part 10 is arranged on a fixing stand 12 and is movable to the fixing stand 12 in the Y-axis direction. Incidentally, the Y-axis is a moving direction of the installation stand 14, the Z-axis is an up and down direction of a vertical direction, and the X-axis is a vertical direction to the Y-axis and the Z-axis.

The FOUP 2 for sealing a plurality of the wafers 1 as housed objects for storage and transportation can be detachably installed on the top in the Z-axis of the installation stand 14. The space for housing the wafers 1 is formed in the FOUP 2. The FOUP 2 has a box shape having a plurality of side surfaces positioned in the horizontal direction toward the inside of the FOUP 2 and a top surface and a bottom surface 2f positioned in the up and down direction. The main opening 2b for taking in and out the wafers 1 housed in the FOUP 2 is formed on a first side surface 2d. The first side surface 2d is one of the multiple side surfaces of the FOUP 2.

The FOUP 2 also has a lid 4 for sealing the main opening 2b. Shelves (not shown) for vertically overlapping the multiple wafers 1 held horizontally are arranged in the FOUP 2. Each of the wafers 1 placed on the shelves is housed in the FOUP 2 at regular intervals. The first bottom hole 5 and the second bottom hole 6 are formed on the bottom surface 2f of the FOUP 2. Structure and function of the first bottom hole 5 and the second bottom hole 6 will be described below.

The load port part 10 is an apparatus for the Front Opening Unified Pod (FOUP) 2 as shown in FIG. 1, but is also applicable to a sealed transportation container having a structure where an opening for taking in and out the wafers 1 is formed on a side surface in the same manner as the FOUP 2. The EFEM 50 can open the main opening 2b formed on the side surface of the FOUP 2 using the load port part 10, and can further transport the wafers housed in the FOUP 2 to the inside of the processing room via the wafer transportation room 52 maintained in a clean state using the transportation robot 54. The EFEM 50 can transport the wafers 1 that have been subjected to processing in the processing room from the processing room to the inside of the FOUP 2 using the transportation robot 54, can close the main opening 2b using the load port part 10, and can house the processed wafers 1 in the FOUP 2.

Figure 2:
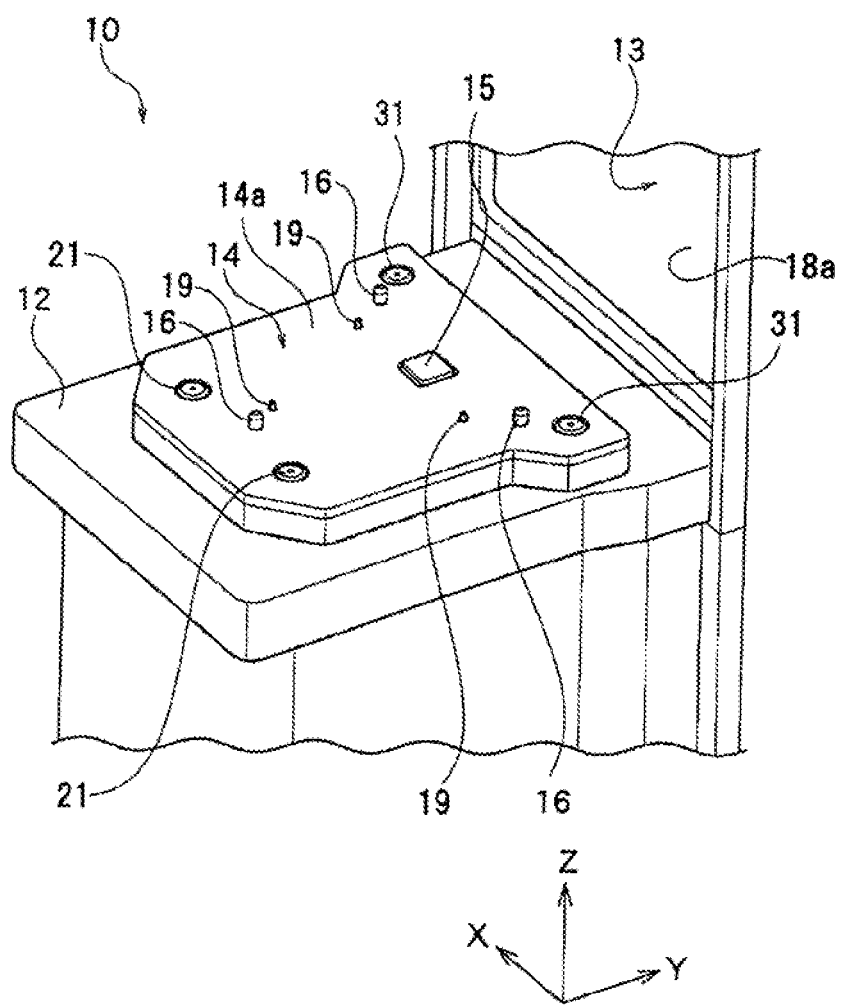
FIG. 2 is a perspective view of a main part showing a vicinity of an installation stand of the EFEM shown in FIG. 1.

FIG. 2 is a perspective view of a main part showing a vicinity of the installation stand 14 of the load port part 10. One or more (preferably three) positioning pins 16 are embedded on a top surface 14a of the installation stand 14. The positioning pins 16 are engaged with positioning portions (not shown) arranged on the bottom surface 2f of the FOUP 2. This uniquely determines a positional relation of the X-axis and the Y-axis between the FOUP 2 and the installation stand 14.

Position detecting sensors 19 are arranged near the respective positioning pins 16 on the top surface 14a of the installation stand 14. The position detecting sensors 19 detect whether the FOUP 2 is positioned and arranged at a predetermined position in the X-Y axis direction on the top surface 14a of the installation stand 14. The position detecting sensors 19 are not limited, and may be contact position detecting sensors or non-contact position detecting sensors. A lock mechanism 15 for locking the FOUP 2 is provided on the top surface 14a of the installation stand 14.

The opening and closing part 18 of the load port part 10 has the door 18a and a door driving part 18b. FIG. 3 shows a state where the opening and closing part 18 of the load port part 10 closes the delivery port 13, and FIG. 4 shows a state where the opening and closing part 18 opens the delivery port 13. The door 18a can open and close the delivery port 13 formed in a wall member 11 for separating the installation stand 14 and the wafer transportation room 52.

The door 18a can engage with the lid 4 of the FOUP 2 entered into the delivery port 13. As shown in FIG. 3, the opening and closing part 18 transports the door 18a engaged with the lid 4 into the wafer transportation room 52 using the door driving part 18b so as to open the main opening 2b of the FOUP 2. Incidentally, the opening and closing part 18 moves the door 18a toward the opposite direction to the direction at the time of opening using the door driving part 18b and returns the lid 4 to the first side surface 2d of the FOUP 2, so that the main opening 2b can be closed by the lid 4. After the main opening 2b is closed by the lid 4, the engagement between the door 18a and the lid 4 is released.

As shown in FIG. 4, the front gas introduction part 17 is arranged on an inner surface 11a. The inner surface 11a is a surface of the wall member 11 on the side of the wafer transportation room 52. The front gas introduction parts 17 are arranged on both sides in the X-axis direction sandwiching the delivery port 13 formed on the wall member 11, though FIG. 4 shows only one side.

The front gas introduction part 17 is connected to a supply passage 17b for supplying a cleaning gas to the front gas introduction part 17. The front gas introduction part 17 is provided with blow nozzles 17a directed toward the delivery port 13. As shown in FIG. 4, the cleaning gas blown from the blow nozzles 17a of the front gas introduction part 17 is introduced into the FOUP 2 via the main opening 2b along with the downward current of the wafer transportation room 52 introduced into the FOUP 2 via the current plate 55 in a state where the main opening 2b of the FOUP 2 is opened and the inside of the FOUP 2 is communicated with the wafer transportation room 52.

As shown in FIG. 3, the gas discharge part 20 is arranged in the lower part in the Z-axis direction of the installation stand 14. The gas discharge part 20 has a first bottom nozzle 21 capable of communicating with the first bottom hole 5 formed at a position distant from the main opening 2b more than a bottom surface middle "C" on the bottom surface 2f of the FOUP 2. As shown in FIG. 2, the gas discharge part 20 has two first bottom nozzles 21. As shown in FIG. 3, each of the first bottom nozzles 21 can be respectively communicated with two first bottom holes 5 formed on the bottom surface 2f of the FOUP 2. The bottom surface middle "C" of the FOUP 2 shown in FIG. 3 means a position that is equidistant from the first side surface 2d where the lid 4 is arranged and the second side surface 2e opposing to the first side surface 2d.

The first bottom nozzles 21 are movable up and down along the Z-axis direction, and are housed in the installation stand 14 in a state where the FOUP 2 is not installed on the installation stand 14. As shown in FIG. 3, the first bottom nozzles 21 rise upward in the Z-axis direction after the FOUP 2 is fixed on the installation stand 14 and protrude from the top surface 14a of the installation stand 14 so as to connect to the first bottom holes 5 of the FOUP 2. Valves not shown for opening and closing the first bottom holes 5 are attached to the first bottom holes 5 of the FOUP 2. The valves are opened when the first bottom nozzles 21 are connected to the first bottom holes 5, and the first bottom nozzles 21 and the first bottom holes 5 are communicated with each other.

The gas discharge part 20 has a first pipe part 22 as a gas discharge passage connected to the first bottom nozzle 21 and capable of discharging the gas in the FOUP 2 to the outside via the first bottom nozzle 21. Furthermore, the gas discharge part 20 has a forcible discharge means 24 arranged in the first pipe part 22 and forcibly discharging the gas in the FOUP 2. One of end portions of the first pipe part 22 is connected to the first bottom nozzle 21, and the other end portion is connected to a discharge port 22a opening toward the outside of the load port part 10.

The forcible discharge means 24 absorbs the gas in the FOUP 2 and forcibly discharges the gas in the FOUP 2 via the first bottom hole 5 and the first bottom nozzle 21. The forcible discharge means 24 is not limited as long as the gas in the FOUP 2 can be absorbed, and may be a suction pump, an air blowing fan, or the like. Incidentally, the forcible discharge denotes a discharge for positively absorbing a gas in the FOUP 2 into the first pipe part 22.

In addition to the gas discharge part 20, the bottom gas introduction part 30 is arranged in the lower part in the Z-axis direction of the installation stand 14. The bottom gas introduction part 30 has a second bottom nozzle 31 capable of communicating with the second bottom hole 6 formed at a position nearer to the main opening 2b than to the bottom surface middle "C" on the bottom surface 2f of the FOUP 2. As shown in FIG. 2, the bottom gas introduction part 30 has two second bottom nozzles 31 capable of being exposed from the installation stand 14. As shown in FIG. 4, each of the second bottom nozzles 31 can be respectively communicated with two second bottom holes 6 formed on the bottom surface 2f of the FOUP 2.

The second bottom nozzles 31 are also movable up and down along the Z-axis direction in the same manner as the first bottom nozzles 21. Valves not shown for opening and closing the second bottom holes 6 are attached to the second bottom holes 6 of the FOUP 2, which is also the same as the first bottom holes 5.

The bottom gas introduction part 30 has a second pipe part 32 connected to the second bottom nozzle 31. A cleaning gas is supplied to the second bottom nozzle 31 via the second pipe part 32. The bottom gas introduction part 30 introduces the cleaning gas into the FOUP 2 via the second bottom hole 6 of the FOUP 2 and the second bottom nozzle 31 communicated with the second bottom hole 6.

The cleaning gas introduced from the front gas introduction part 17 and the bottom gas introduction part 30 into the FOUP 2 is not limited, and may be, for example, a nitrogen gas, another inert gas, a cleaned air where dust is removed by a filer or so, or the like. As shown in FIG. 1, the gas circulating in the wafer transportation room 52 and the circulating passage 57 may be also a nitrogen gas, another inert gas, a cleaned air, or the like. When the gas circulating in the wafer transportation room 52 and the circulating passage 57 is an inert gas, for example, an introduction port of the inert gas is provided at a position in the circulating passage 57 so as to introduce the inert gas from the introduction port into the wafer transportation room 52 and the circulating passage 57 as necessary.

As shown in FIG. 3 and FIG. 4, the cleanliness detection part 40 has a detection element 40a arranged inside the FOUP 2 and detects a cleanliness of the gas inside the FOUP 2 by arithmetically processing a signal from the detection element 40a. The cleanliness detection part 40 is not limited, but is preferably a device capable of detecting a gas component that may affect contamination of the wafers 1 housed in the FOUP 2 or an amount of particles in a gas, such as oxygen concentration meter, water (water vapor) concentration meter, nitrogen concentration meter, and particle counter. Incidentally, the detection element 40a may be arranged in the first pipe part 22 of the gas discharge part 20.

Figure 5:
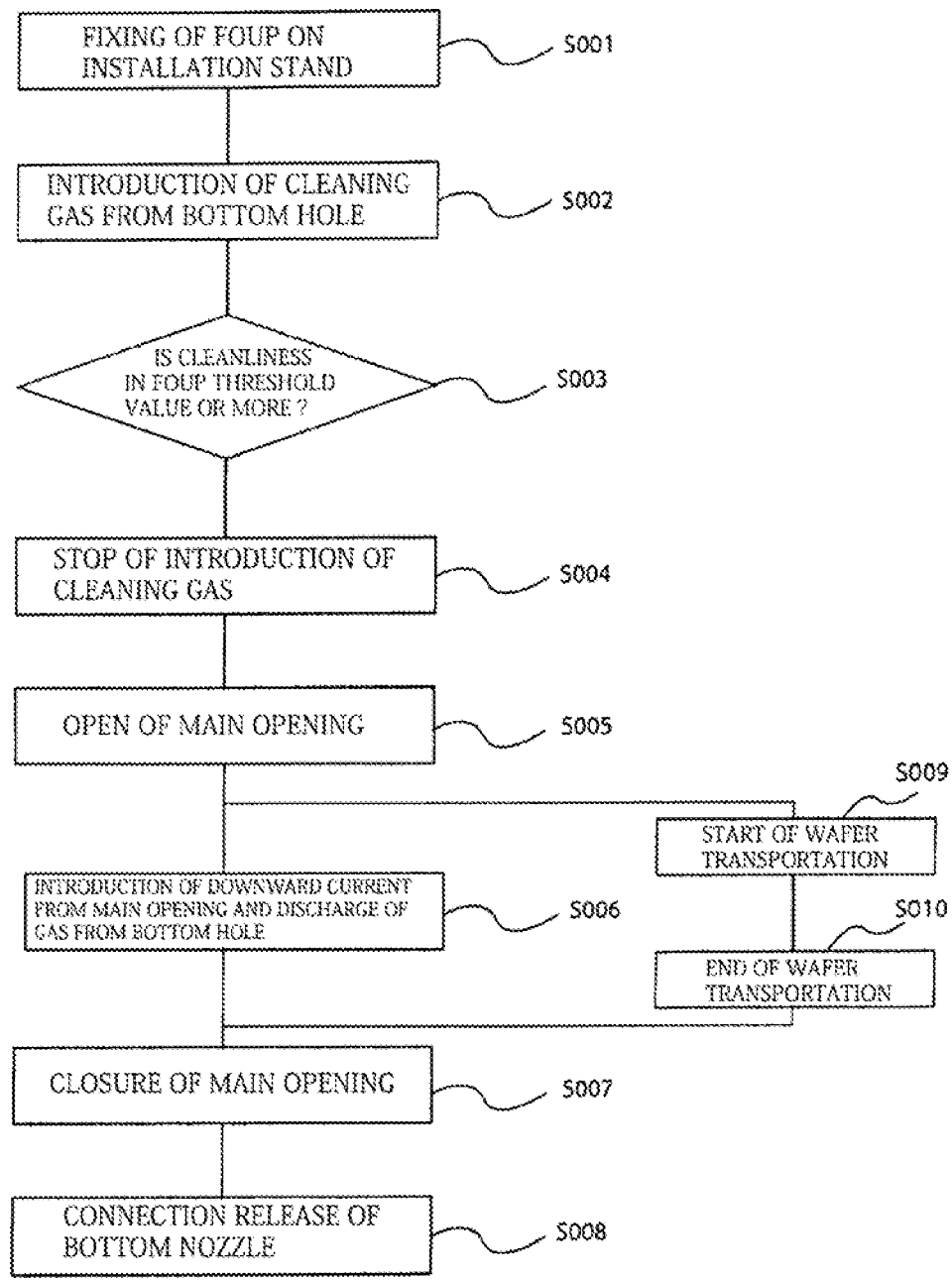
FIG. 5 is a flowchart showing a controlling method of the EFEM shown in FIG. 1.

FIG. 5 is a flowchart showing a controlling method of the EFEM 50 in a transportation step of transporting the wafers 1 housed in the FOUP 2 from the FOUP 2 to the processing room and transporting the processed wafers 1 from the processing room to the FOUP 2. Each step shown in FIG. 5 is controlled by, for example, a control part (not shown) configured to control the entire EFEM 50 containing the load port device 10 and the wafer transportation part 51. Hereinafter, the control step of the EFEM 50 will be described using FIG. 5 etc.

In Step S001 shown in FIG. 5, the EFEM 50 fixes the FOUP 2 housing the wafers 1 before being processed to the installation stand 14 of the load port part 10. The FOUP 2 is automatically transported to the installation stand 14 of the load port part 10 by a ceiling transport system, for example, but a method for transporting the FOUP 2 is not limited. Incidentally, as shown in FIG. 1, the wafer transportation part 51 of the EFEM 50 constantly forms a circulating current in the wafer transportation room 52 by continuing the driving of the transportation room fan 59 even in a state where the delivery port 13 is closed.

In a fixing step of the FOUP 2 shown in Step S001, the load port part 10 drives the lock mechanism 15 so as to fix the FOUP 2 to the installation stand 14 after the position detecting sensors 19 shown in FIG. 2 confirm that the FOUP 2 is installed at an appropriate position.

After the FOUP 2 is fixed on the installation stand 14 (Step S001), the step shown in Step S002 (see FIG. 5) begins, and the load port part 10 of the EFEM 50 introduces the cleaning gas from the second bottom holes 6 of the FOUP 2 into the FOUP 2.

As shown in FIG. 3, in Step S002, the load port part 10 raises the second bottom nozzles 31 of the bottom gas introduction part 30 against the FOUP 2 in a state where the main opening 2b is closed so as to connect and communicate the two second bottom nozzles 31 with the two second bottom holes 6 arranged on the FOUP 2. Furthermore, the load port part 10 supplies the cleaning gas from the second pipe part 32 of the bottom gas introduction part 30 to the second bottom nozzles 31 and introduces the cleaning gas into the FOUP 2 via the second bottom holes 6.

In Step S002, the load port part 10 raises the first bottom nozzles 21 of the gas discharge part 20 against the FOUP 2 in a state where the main opening 2b is closed so as to connect and communicate them with the two first bottom holes 5 arranged on the FOUP 2 at the same time as the rising of the second bottom nozzles 31 or before or after the rising of the second bottom nozzles 31. This makes it possible to discharge the gas in the FOUP 2 to the outside of the FOUP 2 via the first bottom nozzles 21 and makes it possible to more smoothly introduce the cleaning gas from the second bottom nozzles 31 to the FOUP 2.

Next, in Step S003, the EFEM 50 carries out a detection step where a cleanliness in the FOUP 2 is detected. The cleanliness detection part 40 of the load port part 10 of the EFEM 50 calculates a cleanliness of a gas in the FOUP 2 by performing a predetermined arithmetical processing to a detection signal from the detection element 40a, and further uses the calculated cleanliness so as to determine whether the inside of the FOUP 2 is cleaner than a predetermined state. Incidentally, the cleanliness detected in the detection step may have a larger value when the inside of the FOUP 2 is cleaner, or may have a smaller value when the inside of the FOUP 2 is cleaner.

When the EFEM 50 detects that the inside of the FOUP 2 is cleaner than a predetermined state in the detection step of Step S003, Step S004 begins, and the first cleaning step is ended. On the other hand, when the EFEM 50 detects that the inside of the FOUP 2 is not cleaner than a predetermined state in the detection step of Step S003, the first cleaning step is continued, and the detection step (Step S003) is repeated at a predetermined frequency.

Next, in Step S004 (see FIG. 5), the load port part 10 of the EFEM 50 stops the introduction of the cleaning gas into the FOUP 2 via the second bottom holes 6 and the bottom gas introduction part 30. The load port part 10 stops the introduction of the cleaning gas into the FOUP 2 by stopping the supply of the cleaning gas from the second pipe part 32 to the second bottom nozzles 31. Incidentally, the connection between the first bottom nozzles 21 and the first bottom holes 5 is maintained after the first cleaning step. The communication state between the second bottom nozzles 31 and the second bottom holes 6 is not limited.

Incidentally, the load port part 10 moves the installation stand 14 in the Y-axis direction (positive direction) so as to move the FOUP 2 fixed on the installation stand 14 to a position where the first side surface 2*d* of the FOUP 2 enters the delivery port 13 in parallel with the introduction and stop steps of the cleaning gas shown in Step S002 to Step S004 or before the introduction of the cleaning gas or after the stop of the introduction of the cleaning gas (see FIG. 4). The order of the stop of the cleaning gas (Step S004) and the opening of the main opening 2*b* mentioned below (Step S005) may be replaced from the order shown in FIG. 5. That is, the stop of the cleaning gas (Step S004) may be carried out after the main opening 2*b* is opened (Step S005).

In Step S005 (see FIG. 5), the load port part 10 opens the main opening 2*b* of the FOUP 2 and airtightly connects the FOUP 2 and the wafer transportation room 52. In Step S005, the load port part 10 engages the door 18*a* of the opening and closing part 18 with the lid 4 of the FOUP 2 moved to the position shown in FIG. 4 in advance. Furthermore, the door 18*a* is moved by the door driving part 18*b* so as to remove the lid 4 from the portion where the wafers are housed in the FOUP 2 and open the main opening 2*b*. The removed lid 4 is moved along with the door 18*a* to a position where the transportation of the wafers 1 by the transportation robot 54 is not disturbed.

Next, in Step S006 (see FIG. 5), a part of the downward current 80 formed in the wafer transportation room 52 is guided by the current plate 55 arranged in the wafer transportation room 52 and flows into the FOUP 2 connected to the wafer transportation room 52 via the main opening 2*b*. Furthermore, a second cleaning step of the FOUP 2 is carried out by discharging the gas in the FOUP 2 via the first bottom holes 5 formed at a position distant from the main opening 2*b* more than the bottom surface middle "C" and the first bottom nozzles 22 connected thereto. Incidentally, as shown in FIG. 4, the load port part 10 may inject the cleaning gas from the blow nozzles 17*a* of the front gas introduction parts 17 toward the main opening 2*b* so as to introduce the cleaning gas into the FOUP 2 along with the downward current 80.

The first bottom nozzles 21 of the load port part 10 are connected to the first bottom holes 5 of the FOUP 2 even after the end of the above-mentioned first cleaning step, and the first pipe part 22 and the inside of the FOUP 2 are communicated via the first bottom nozzle 21 and the first bottom hole 5. Thus, the gas in the FOUP 2 is discharged via the first bottom holes 5 in Step S006.

Furthermore, in Step S006, the load port part 10 can forcibly discharge the gas in the FOUP 2 by operating the forcible discharge means 24 of the gas discharge part 20. It is possible to select whether a forcible discharge is carried out or a spontaneous discharge where the gas in the FOUP 2 is pushed out from the first bottom holes 5 by the downward current 80 introduced from the main opening 2*b* is carried out depending upon kind or amount of an outgas that may occur from the wafers 1, the number of wafers 1 housed in the FOUP 2, and the like.

While the load port part 10 is carrying out the step shown in Step S006, the wafer transportation part 51 shown in FIG. 1 operates an arm 54*a* of the transportation robot 54 so as to start the transportation step of the wafers 1 (Step S009 in FIG. 5). In the transportation step of the wafers 1, the wafer transportation part 51 transports the wafers 1 before being processed from the FOUP 2 to the processing room via the main opening 2*b* being opened and the wafer transportation room 52. The wafer transportation part 51 transports the processed wafers 1 from the processing room to the FOUP 2 via the wafer transportation room 52 and the main opening 2*b* being opened.

When all of the processed wafers 1 are returned to the FOUP 2, the wafer transportation part 51 shown in FIG. 1 ends the transportation of the wafers (Step S010). After the end of the transportation of the wafers, the opening and closing part 18 of the load port part 10 shown in FIG. 4 closes the main opening 2*b* of the FOUP 2 (Step S007). In Step S007, the load port part 10 moves the door 18*a* by the door driving part 18*b* shown in FIG. 4 and returns the lid 4 engaged with the door 18*a* to the first side surface 2*d* of the FOUP 2, so that the main opening 2*b* is closed. After the lid 4 closes the main opening 2*b*, the engagement between the door 18*a* and the lid 4 is released.

Incidentally, when the main opening 2*b* of the FOUP 2 is closed, the load port part 10 stops the discharge of the gas from the first bottom holes 5 by stopping the forcible discharge means 24 if a forcible discharge is carried out in Step S006. When the cleaning gas is blown from the front gas introduction part 17 in Step S005, the load port part 10 stops the blowing of the cleaning gas by the front gas introduction part 17 in accordance with the closure of the main opening 2*b*. The wafer transportation part 51, however, continues to drive the transportation room fan 59 and continues to form the circulating current in the wafer transportation room 52 and the circulating passage 57 so as to maintain the cleanliness of the wafer transportation room 52.

After Step S007, the load port part 10 releases the connection between the first bottom nozzles 21 and the first bottom holes 5 shown in FIG. 4 (Step S008). The load port part 10 moves the installation stand 14 in the Y-axis direction (negative direction) so as to return the FOUP 2 housing the processed wafers 1 to the position of the fixing step (Step S001) shown in FIG. 3, and thereafter releases the fixing between the FOUP 2 and the installation stand 14.

In the controlling method of the EFEM 50, the first cleaning step (STEP S002) of introducing the cleaning gas from the second bottom holes 6 of the FOUP 2 is carried out so as to clean the inside of the FOUP 2 and effectively protect the wafers 1 from oxidation and contamination even in a state where the main opening 2*b* is closed. It is also possible to prevent a gas having a low cleanliness from flowing from the FOUP 2 into the wafer transportation room 52 and maintain a favorable cleanliness in the wafer transportation room 52. In particular, it is possible to securely prevent a gas having a low cleanliness from flowing from the FOUP 2 into the wafer transportation room 52 by detecting a cleanliness of the gas in the FOUP 2 (Step S003) and thereby carrying out the step of opening the main opening 2*b* (Step S005).

In the second cleaning step carried out while the wafers are being transported (Step S006), the gas in the FOUP 2 is discharged from the first bottom nozzles 21 connected to the first bottom holes 5 of the FOUP 2 in the first cleaning step (Step S002), and it is thus possible to favorably maintain the cleanliness in the FOUP 2 and the wafer transport room 52 even while the wafers 1 are being transported. The outgas generated from the wafer soon after being processed can be prevented from oxidizing and contaminating the wafers 1 in the FOUP 2 by discharging the gas in the FOUP 2 from the first bottom nozzles 21.

The second cleaning step (Step S006) of introducing the gas from the main opening 2*b* is carried out in a state where the introduction of the cleaning gas from the second bottom holes 6 is stopped, which increases the inflow amount of the gas from the main opening 2*b* and forms a more favorable current for discharging the outgas in the entire inside of the FOUP 2.

Furthermore, in the control of the EFEM 50, the forcible discharge means 24 discharges the gas in the FOUP 2 so as to effectively introduce the gas in the wafer transportation room 52 from the main opening 2*b* into the FOUP 2, and the current is formed in the FOUP 2 so as to effectively discharge the outgas generated from the processed wafers 1.

Furthermore, in the above-mentioned EFEM 50, the first pipe part 22 of the load port part 10 functions as a discharge passage for discharging the gas from the FOUP 2 in both the first cleaning step (Step S002) of introducing the cleaning gas from the second bottom holes 6 and the second cleaning step (Step S006) of introducing the downward current of the wafer transportation room 52 via the main opening 2*b*. Thus, the EFEM 50 makes it possible to achieve two kinds of cleaning steps having different modes with a simple configuration.

In the control of the EFEM 50, the gas in the FOUP 2 is discharged from the first bottom holes 5 distant from the main opening 2*b*, and thus a current going from the main opening 2*b* to the first bottom holes 5 is formed in the entire inside of the FOUP 2 housing the wafers 1. Then, the current formed in the FOUP 2 passes near the surfaces of the wafers 1, which promotes the discharge of the outgas. This allows the EFEM 50 to prevent a problem that the wafers 1 in the FOUP 2 are oxidized or contaminated due to the outgas generated from the processed wafers 1.

Incidentally, the first bottom holes 5 discharging the gas in the FOUP 2 are preferably formed at a position distant from the main opening 2*b* as much as possible in view of forming a current discharging the outgas in the entire inside of the FOUP 2. Thus, the distance from the first bottom holes 5 to the main opening 2*b* is preferably two thirds or more of diameters of the housed wafers 1, and is more preferably diameters or more of the wafers 1.

In the control of the EFEM 50, a part of the downward current flows into the FOUP 2 via the main opening 2*b* of the FOUP 2 taking in and out the wafers 1 by introducing the downward current of the wafer transportation room 52 due to the current plate 55 in a state where the main opening 2*b* of the FOUP 2 is airtightly connected to the wafer transportation room 52. This allows the EFEM 50 to effectively discharge the outgas generated from the processed wafers 1 to the outside of the FOUP 2 while the wafers 1 are being taken in and out via the main opening 2*b*. That is, the main opening 2*b* has a wide opening area, and the downward current for maintaining the cleanliness is formed in the wafer transportation room 52, whereby the gas in the wafer transportation room 52 easily flows into the FOUP 2 due to the introduction of the downward current by the current plate 55.

The cleaning step (second cleaning step) of the FOUP 2 by the EFEM 50 can be carried out with a simple configuration where the current plate 55 is arranged in the wafer transportation room 52, and the first bottom nozzles 21 for discharging the gas are connected to the first bottom holes 5.

Accordingly, the present invention is described by showing the embodiment, but the above-mentioned EFEM 50 is just an embodiment of the present invention, and variations other than the embodiment are included within the technical scope of the present invention.

For example, in the EFEM 50, the gas discharge part 20 has the two first bottom nozzles 21 capable of communicating with the two first bottom holes 5, but there is no limit to the number of the first bottom nozzles 21 owned by the gas discharge part 20, and there is no limit to the number of the first bottom holes 5 connectable to the first bottom nozzles 21. Also, there is no limit to the number of the second bottom nozzles 31 owned by the bottom gas introduction part 30, and there is no limit to the number of the second bottom holes 6 connectable to the second bottom nozzles 31.

It is preferred to maintain the connection state between the first bottom holes 5 and the first bottom nozzles 21 of the FOUP 2 from Step S002 (first cleaning step) before Step S008 is carried out. Incidentally, the connection between the first bottom holes 5 and the first bottom nozzles 21 of the FOUP 2 may be temporality released except while the first cleaning step and the second cleaning step are being carried out.

In the controlling method shown in FIG. 5, the steps after Step S004 do not start unless the inside of the FOUP 2 becomes cleaner than a predetermined state, but the controlling method of the EFEM 50 is not limited thereto, and the steps after Step S004 may start after the first cleaning step is carried out for a predetermined time, for example.

Figure 6:
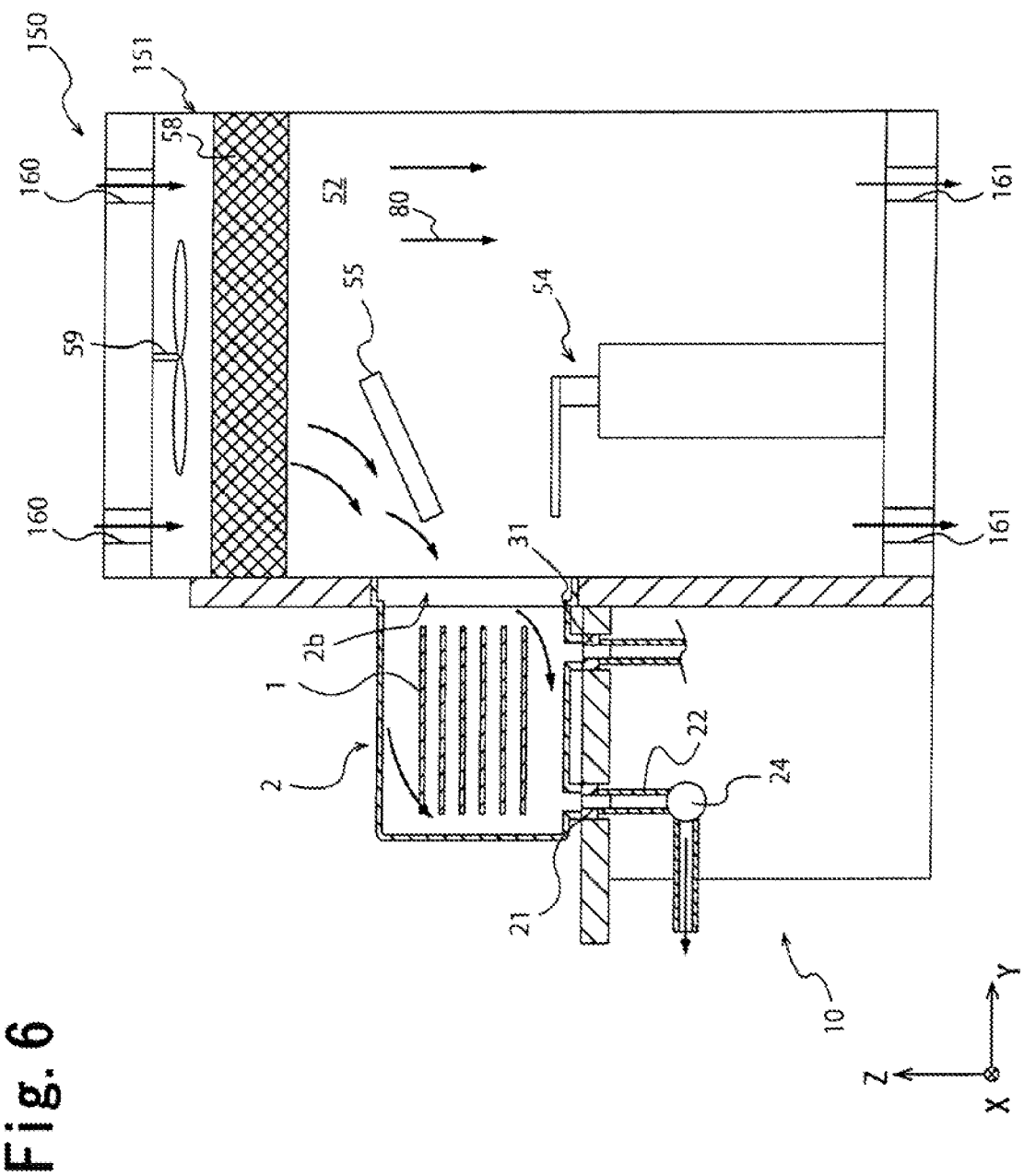
FIG. 6 is a schematic view of an EFEM according to Second Embodiment of the present invention.

FIG. 6 is a schematic cross sectional view showing an EFEM 150 according to Second Embodiment of the present invention. The EFEM 150 is the same as the EFEM 50 according to First Embodiment except that a wafer transportation part 151 does not have the circulating passage 57 but has introduction ports 160 arranged over the wafer transportation room 52 and discharge ports 161 arranged below the wafer transportation room 52. Incidentally, the descriptions of the front gas introduction part 17, the lid 4, the opening and closing part 18, and the like are omitted in FIG. 6.

In a second cleaning step of the EFEM 150 shown in FIG. 6, an air or an inert gas is introduced from the introduction ports 160 arranged over the wafer transportation room 52. The air or inert gas introduced above the wafer transportation room 52 passes through the transportation room filter 58, flows into the wafer transportation room 52, and is thereafter discharged from the discharge ports 161 arranged below the wafer transportation room 52. A downward current by the transportation room fan 59 is also formed in the wafer transportation room 52 of the EFEM 150 in the same manner as First Embodiment shown in FIG. 1. The second cleaning step in the EFEM 150 shown in FIG. 6 demonstrates the same effect as the case of the EFEM 50 shown in FIG. 1 by introducing a part of the downward current 80 into the FOUP 2 using the current plate 55 and further carrying out the second cleaning step of the FOUP 2 for discharging the gas in the FOUP 2 from the first bottom nozzles 21.

Figure 7:
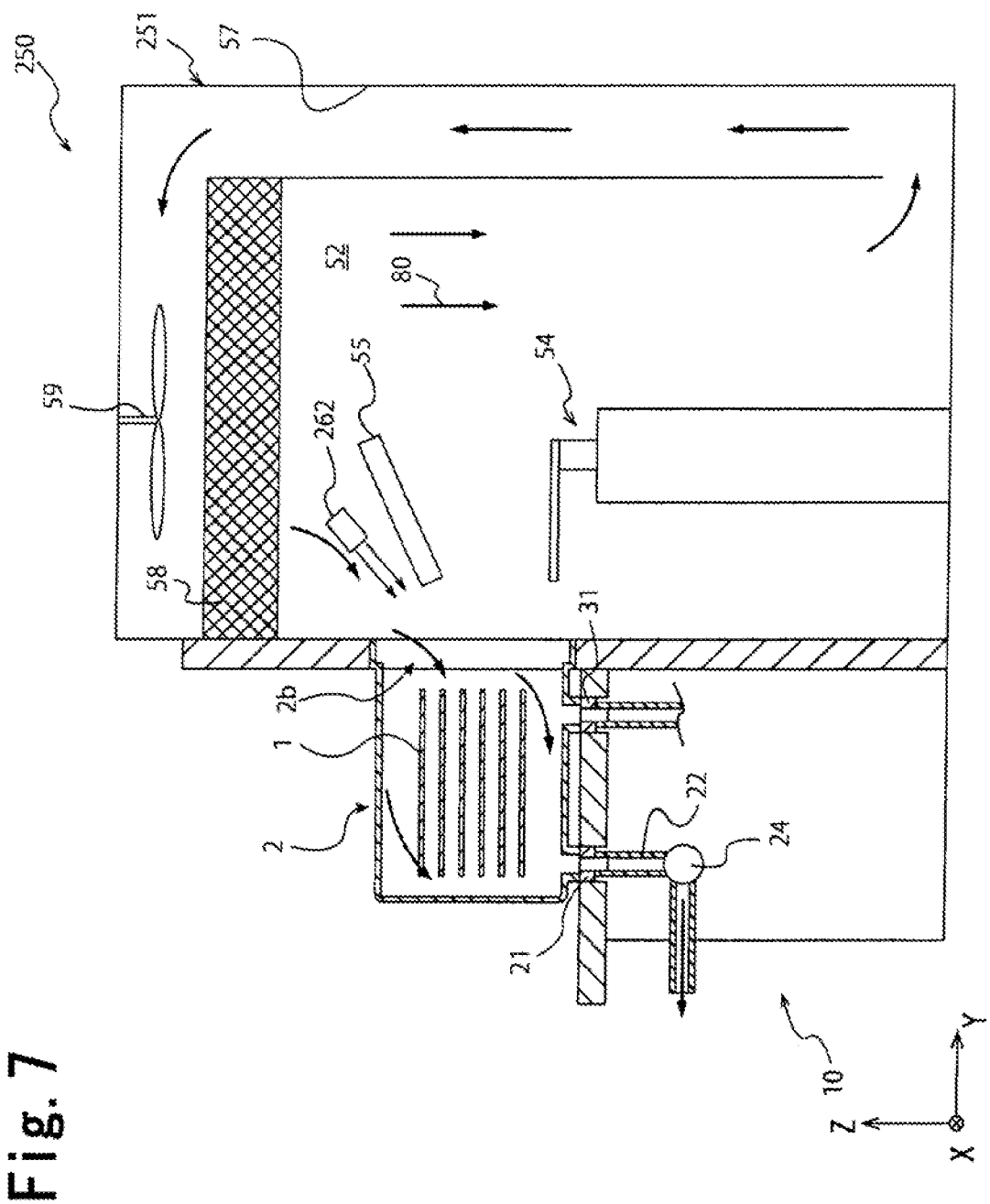
FIG. 7 is a schematic view of an EFEM according to Third Embodiment of the present invention.

FIG. 7 is a schematic cross sectional view showing an EFEM 250 according to Third Embodiment of the present invention. The EFEM 250 is the same as the EFEM 50 shown in FIG. 1 except that a wafer transportation part 251 has a transportation room blow nozzle 262 as a gas blow means in addition to the current plate 55. The transportation room blow nozzle 262 is arranged in the wafer transportation room 52 and blows a cleaning gas from the wafer transportation room 52 toward the main opening 2b of the FOUP 2.

A cleaning gas is supplied from a pipe part not shown to the transportation room blow nozzle 262. The cleaning gas blown from the transportation room blow nozzle 262 may be an inert gas, a clean air, or the like in the same manner as the cleaning gas discharged from the second bottom nozzles 31, but preferably has a higher cleanliness than that of a gas in the wafer transportation room 52 constituting the downward current 80.

In this way, the method for introducing the gas from the main opening 2b into the FOUP 2 in the second cleaning step shown in FIG. 5 is not limited to the method using the current plate 55 shown in FIG. 1 or the method using the front gas introduction part 17, and may use the transportation room blow nozzle 262 of the EFEM 250 as shown in FIG. 7. In the second cleaning step by the EFEM 250, the wafer transportation part 251 has the transportation room blow nozzle 262, which promotes the inflow of the gas from the main opening 2b into the FOUP 2 and the replacement of the gas in the FOUP 2 in the second cleaning step. This allows the EFEM 250 to effectively prevent a problem that the outgas generated from the processed wafers 1 adversely affects the nearby wafers 1. The control by the EFEM 250 demonstrates the same effect as the control by the EFEM 50 shown in FIG. 1.

FIG. 8 is a schematic cross sectional view showing an EFEM 350 according to Fourth Embodiment of the present invention. One of first bottom nozzles 321 of a load port part 310 of the EFEM 350 can introduce a cleaning gas from the first bottom hole 5 in Step S002 (first cleaning step) in FIG. 5, and can discharge a gas in the FOUP 2 from the first bottom hole 5 in Step S006 (second cleaning step).

The EFEM 350 having the first bottom nozzle 321 has a valve 342 capable of switching a state where the first bottom nozzle 321 is connected to the first pipe part 322 and a state where the first bottom nozzle 321 is connected to the second pipe part 332. The EFEM 350 having the bottom nozzle 321 can increase the number of introduction passages of the cleaning gas in the first introduction step, and thus can quickly clean the inside of the FOUP 2 before the main opening 2b is opened. In addition, both the introduction of the gas into the FOUP 2 and the discharge of the gas from the FOUP 2 can be carried out by the same first bottom nozzle 321, and it is thus possible to reduce the number of bottom holes and bottom nozzles and simplify the structure of the FOUP and the load port device. The control by the EFEM 350 demonstrates the same effect as the control by the EFEM 50 shown in FIG. 1.

NUMERICAL REFERENCES

1 . . . wafer
2 . . . FOUP
2f . . . bottom surface
4 . . . lid
5 . . . first bottom hole
6 . . . second bottom hole
10 . . . load port part
11 . . . wall member
14 . . . installation stand
17 . . . front gas introduction part
17a . . . blow nozzle
18 . . . opening and closing part
18a . . . door
20 . . . gas discharge part
21 . . . first bottom nozzle
22 . . . first pipe part
24 . . . forcible discharge part
30 . . . bottom gas introduction part
31 . . . second bottom nozzle
32 . . . second pipe part
55 . . . current plate
50, 150 . . . EFEM
51, 151 . . . wafer transportation part
52 . . . wafer transportation room
57 . . . circulating passage
59 . . . transportation room fan
80 . . . downward current
"C" . . . bottom surface middle

The invention claimed is:

1. A controlling method for a wafer transportation part configured to have a wafer transportation room passed by a wafer transported to a processing room and a load port part configured to airtightly connect a main opening formed on a container housing the wafer to the wafer transportation room on an EFEM, the controlling method comprising:
   a fixing step of fixing the container on an installation stand of the load port part;
   a first cleaning step of connecting at least one of a plurality of first bottom nozzles and at least one of a plurality of second bottom nozzles of the load port part to a plurality of bottom holes formed on a bottom surface of the container installed on the installation stand, and introducing a cleaning gas into the container via the at least one second bottom nozzle while discharging a gas from the container via the at least one first bottom nozzle in a state where the main opening is closed;
   a connection step of stopping the introduction of the cleaning gas from the at least one second bottom nozzle and opening the main opening so as to provide an airtight connection between the container and the wafer transportation room; and
   a wafer transportation step of transporting the wafer from the container to the processing room via the main opening being opened and the wafer transportation room, and transporting the wafer from the processing room to the container via the wafer transportation room and the main opening being opened.

2. The controlling method according to claim 1, further comprising a detection step of detecting a cleanliness in the container,
   wherein the connection step is carried out after the detection step detects that the inside of the container is cleaner than a predetermined state.

3. The controlling method according to claim 1, further comprising a second cleaning step of introducing a gas from the wafer transportation room into the container via the main opening being opened.

4. The controlling method according to claim 2, further comprising a second cleaning step of introducing a gas from the wafer transportation room into the container via the main opening being opened.

5. The controlling method according to claim 3, wherein the second cleaning step introduces a gas from the wafer transportation room into the container by a current plate configured to introduce a part of a downward current in the wafer transportation room to the main opening.

6. The controlling method according to claim 4, wherein the second cleaning step introduces the gas from the wafer transportation room into the container by a current plate configured to introduce a part of a downward current in the wafer transportation room to the main opening.

7. The controlling method according to claim 3, wherein the second cleaning step discharges the gas in the container via at least one of the first bottom nozzles connected to at least one of the bottom holes in the first cleaning step and communicated with at least one of the bottom holes formed at a position distant from the main opening more than a bottom surface middle on the bottom surface of the container.

8. The controlling method according to claim 4, wherein the second cleaning step discharges the gas in the container via at least one of the first bottom nozzles connected to at least one of the bottom holes in the first cleaning step and communicated with at least one of the bottom holes formed at a position distant from the main opening more than a bottom surface middle on the bottom surface of the container.

9. The controlling method according to claim 5, wherein the second cleaning step discharges the gas in the container via at least one of the first bottom nozzles connected to at least one of plurality of the bottom holes in the first cleaning step and communicated with at least one of the plurality of bottom holes formed at a position distant from the main opening more than a bottom surface middle on the bottom surface of the container.

10. The controlling method according to claim 6, wherein the second cleaning step discharges the gas in the container via at least one of the first bottom nozzles connected to at least one of the plurality of bottom holes in the first cleaning step and communicated with at least one of the plurality of bottom holes formed at a position distant from the main opening more than a bottom surface middle on the bottom surface of the container.

11. A controlling method for a wafer transportation part configured to have a wafer transportation room passed by a wafer transported to a processing room and a load port part configured to airtightly connect a main opening formed on a container housing the wafer to the wafer transportation room on an EFEM, the controlling method comprising:
a fixing step of fixing the container on an installation stand of the load port part;
a first cleaning step of connecting at least one of a plurality of first bottom nozzles and at least one of a plurality of second bottom nozzles of the load port part to a plurality of bottom holes formed on a bottom surface of the container installed on the installation stand, and introducing a cleaning gas into the container via the at least one second bottom nozzle while discharging a gas from the container via the at least one first bottom nozzle in a state where the main opening is closed;
a connection step of stopping the introduction of the cleaning gas from the at least one second bottom nozzle, while continuing the discharge of the gas from the container even after the introduction of the cleaning gas is stopped, followed by opening the main opening so as to airtightly connect the container and the wafer transportation room; and
a wafer transportation step of transporting the wafer from the container to the processing room via the main opening being opened and the wafer transportation room, and transporting the wafer from the processing room to the container via the wafer transportation room and the main opening being opened.

\* \* \* \* \*